(12) United States Patent
Sundahl et al.

(10) Patent No.: US 6,621,168 B2
(45) Date of Patent: Sep. 16, 2003

(54) INTERCONNECTED CIRCUIT BOARD ASSEMBLY AND SYSTEM

(75) Inventors: Robert C. Sundahl, Phoenix, AZ (US); Kenneth Wong, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/750,444

(22) Filed: Dec. 28, 2000

(65) Prior Publication Data
US 2002/0084536 A1 Jul. 4, 2002

(51) Int. Cl.[7] .............................................. H01L 23/48
(52) U.S. Cl. ..................... 257/778; 257/737; 257/779; 257/783
(58) Field of Search ........................ 257/737, 741, 257/778, 779, 780, 782, 783

(56) References Cited

U.S. PATENT DOCUMENTS

| | | | |
|---|---|---|---|
| 4,693,770 A | | 9/1987 | Hatada ........................ 156/151 |
| 4,818,728 A | * | 4/1989 | Rai et al. ..................... 438/108 |
| 5,233,504 A | * | 8/1993 | Melton et al. ............... 361/760 |
| 5,311,059 A | | 5/1994 | Banerji et al. ............... 257/778 |
| 5,583,350 A | | 12/1996 | Norman et al. ................ 257/88 |
| 5,659,203 A | * | 8/1997 | Call et al. .................... 257/778 |
| 5,703,394 A | | 12/1997 | Wei et al. .................... 257/433 |
| 5,722,161 A | | 3/1998 | Marrs ........................... 29/841 |
| 5,726,502 A | * | 3/1998 | Beddingfield ............... 257/797 |
| 5,764,485 A | * | 6/1998 | Lebaschi ..................... 361/774 |
| 5,767,580 A | | 6/1998 | Rostoker ..................... 257/737 |
| 5,795,818 A | | 8/1998 | Marrs .......................... 438/612 |
| 5,801,446 A | * | 9/1998 | DiStefano et al. .......... 257/778 |
| 5,838,069 A | * | 11/1998 | Itai et al. ..................... 257/766 |
| 5,858,806 A | | 1/1999 | Nishida .......................... 438/7 |
| 5,861,678 A | | 1/1999 | Schrock ....................... 257/783 |
| 5,889,568 A | | 3/1999 | Seraphim et al. .............. 349/73 |
| 5,907,187 A | * | 5/1999 | Koiwa et al. ................. 257/737 |
| 5,912,505 A | * | 6/1999 | Itoh et al. .................... 257/737 |
| 5,987,358 A | | 11/1999 | Sosebee et al. ............... 607/36 |
| 6,018,197 A | * | 1/2000 | Saiki et al. .................. 257/784 |
| 6,040,631 A | * | 3/2000 | Dibble et al. ............... 257/783 |
| 6,324,754 B1 | * | 12/2001 | DiStefano et al. ............ 29/840 |

FOREIGN PATENT DOCUMENTS

| | | | |
|---|---|---|---|
| WO | 99/03374 | 1/1999 | ........... A47B/23/04 |
| WO | 99/03375 | 1/1999 | ........... A47B/81/06 |
| WO | 99/03381 | 1/1999 | ........... A47F/10/04 |
| WO | 99/41732 | 8/1999 | ............. G09G/3/00 |
| WO | 99/41787 | 8/1999 | ........... H01L/25/16 |
| WO | 99/41788 | 8/1999 | ........... H01L/27/15 |

* cited by examiner

*Primary Examiner*—George Eckert
(74) *Attorney, Agent, or Firm*—Schwegman, Lundberg, Woessner & Kluth, P.A.

(57) ABSTRACT

An electrical assembly (200, FIG. 2) is formed from two, interconnected circuit boards (202, 204). Conductive spacers (240) and a conductive material (260) are placed between complementary bond pads (218, 232) on the circuit boards. The conductive spacers are formed from a material that maintains its mechanical integrity during the process of attaching the circuit boards. The conductive material is a solder or conductive adhesive used to mechanically attach the circuit boards. In addition, an insulating material (270) is inserted into an interface region (250) between the circuit boards. The insulating material provides additional mechanical connection between the circuit boards. In one embodiment, one circuit board (202) includes a glass panel that holds an array of organic light emitting diodes (OLEDs), and the other circuit board (204) is a ceramic circuit board. Together, the interconnected circuit board assembly (200) forms a portion of a flat panel display (1102, FIG. 11).

8 Claims, 9 Drawing Sheets

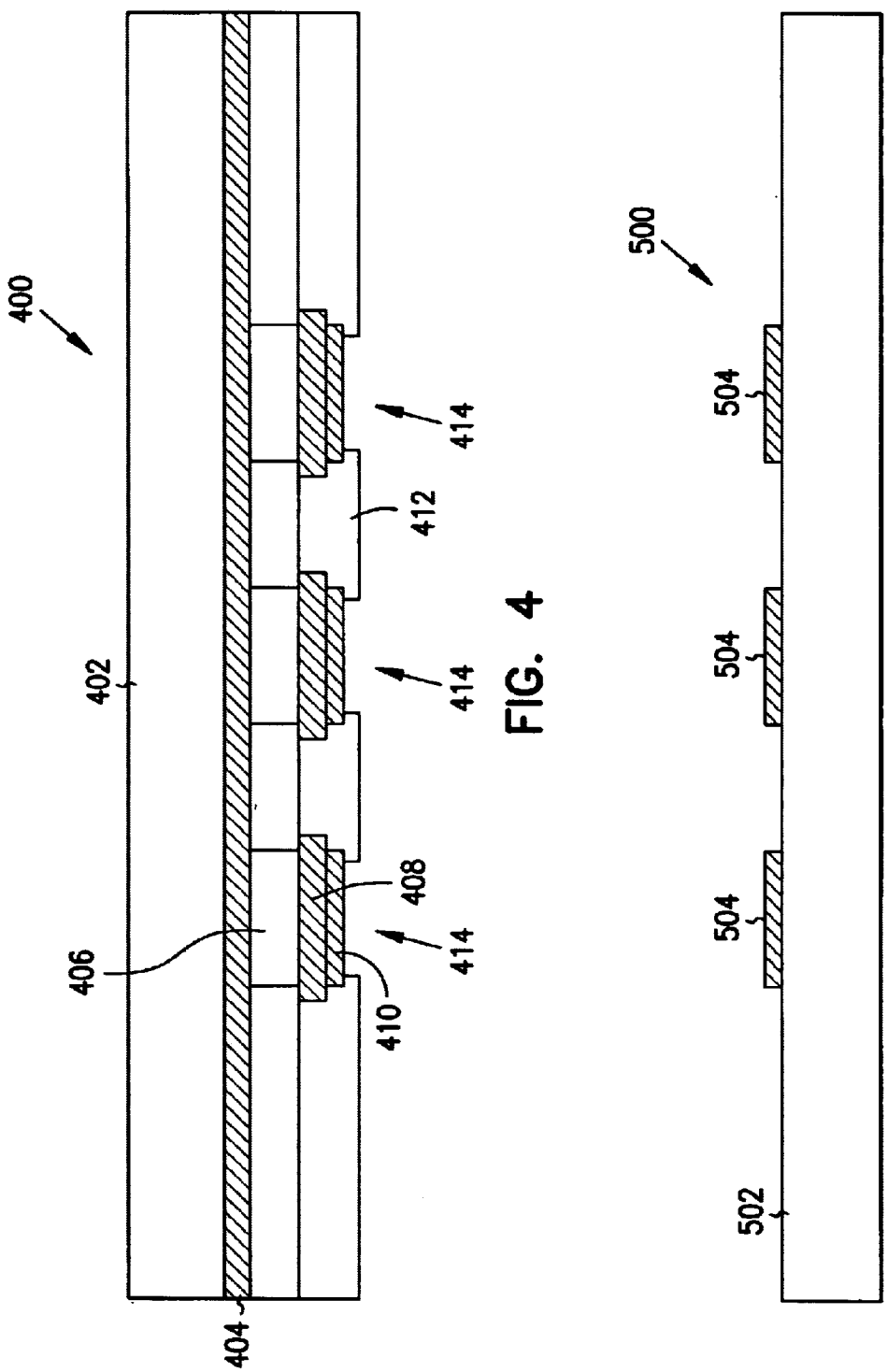

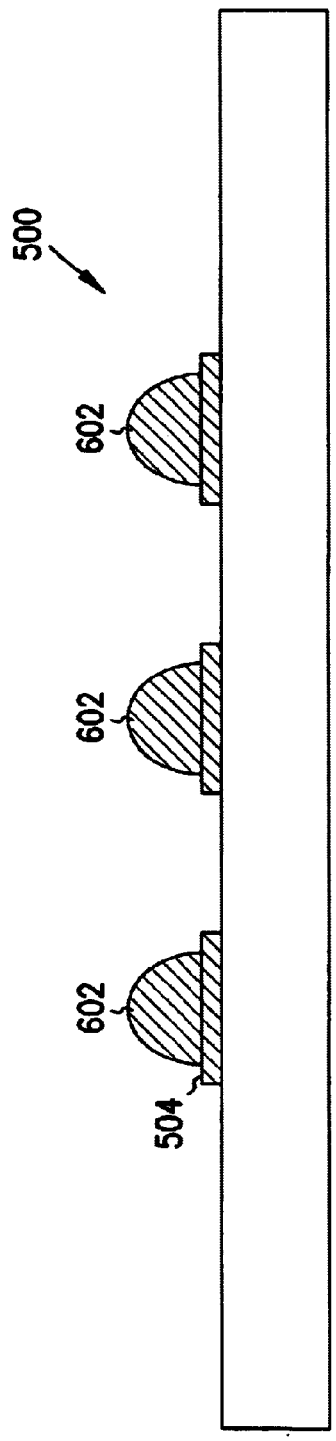
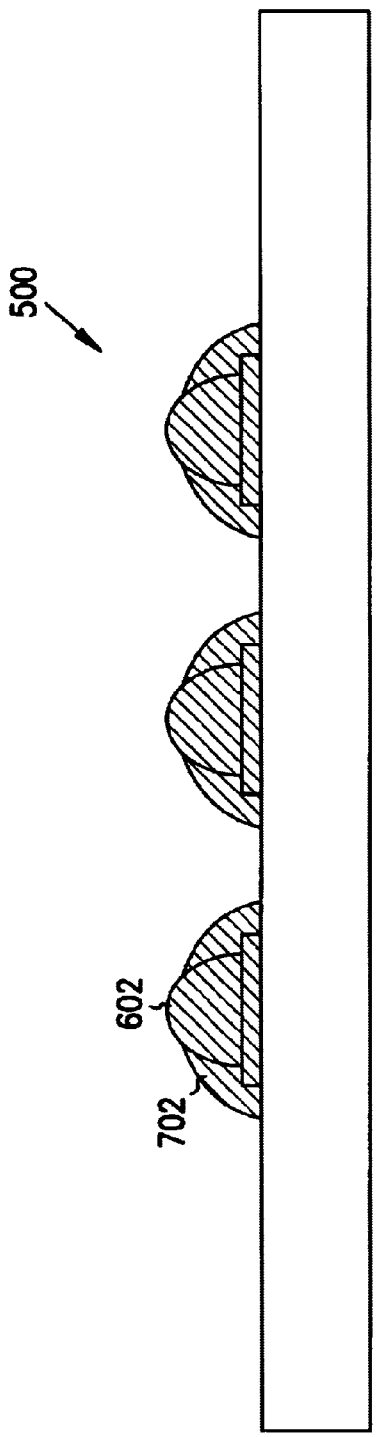

INTERCONNECTED CIRCUIT BOARD ASSEMBLY AND SYSTEM

TECHNICAL FIELD OF THE INVENTION

The present invention relates generally to electrical assemblies that include two or more interconnected circuit boards, and more particularly, to electronic assemblies for flat panel displays, and methods of their manufacture.

BACKGROUND OF THE INVENTION

For various applications, it is necessary to electrically and mechanically connect circuit boards. In some cases, the circuit boards are composed of different substrate materials, such as glass, ceramic, organic materials or other materials. For example, some types of flat panel displays include electronic sub-assemblies, each of which includes a ceramic circuit board electrically connected to a glass plate. The glass plate holds an array of organic light emitting diode (OLED) pixels, which are driven by circuitry on the ceramic circuit board. While manufacturing such an assembly, it is necessary to simultaneously establish hundreds or thousands of electrical interconnections between the circuit board and the OLED pixels on the glass plate.

Some prior art methods of electrically connecting circuit boards use a reflow process. Using this process, solder is selectively deposited on either or both of the circuit boards' bond pads, the circuit boards are aligned and pressed together, and the assembly is heated until the solder melts and reflows. Unfortunately, several factors make this method of simultaneously forming a large number of electrical interconnections prone to low manufacturing yields. In particular, variations in circuit board flatness, pad coordinates, alignment, and lamination pressure may result in open circuits between some complementary bond pads. This is particularly true when the interconnections are spread over relatively large areas on the surfaces of the circuit boards.

What are needed are interconnected circuit board assemblies that are less prone to open circuit defects due to variations in circuit board flatness, pad coordinates, alignment, and lamination pressure. Further needed are high yield methods of manufacturing interconnected circuit board assemblies.

BRIEF DESCRIPTION OF THE DRAWINGS

FIGS. 4–10 illustrate various stages of manufacturing an interconnected circuit board assembly in accordance with one embodiment of the present invention.

DETAILED DESCRIPTION

The various embodiments of the present invention provide interconnected circuit board assemblies that are less prone than prior art assemblies to open circuit defects due to variations in circuit board flatness, pad coordinates, alignment, and lamination pressure. Further provided are high yield methods of manufacturing interconnected circuit board assemblies.

This is accomplished, in one embodiment, by placing conductive spacers in regions between complementary bond pads on the circuit boards, as is explained in detail, below. The conductive spacers are formed from a material that maintains its mechanical integrity during the process of attaching the circuit boards.

In one embodiment, the present invention results in the electrical and mechanical attachment of a ceramic circuit board to a glass panel that holds an array of organic light emitting diodes (OLEDs). The resultant structure forms a modular element of a flat panel display. In such an application, hundreds of interconnections could be required within a relatively small area (e.g., within 2–10 inch$^2$). In other embodiments, different types of circuit boards could be interconnected, and more or fewer interconnections could be required within a larger or smaller surface area. For ease of description, the embodiments associated with a flat panel display are described below. The use of the flat panel display embodiments is not meant to limit the scope of the present invention, as the various embodiments could be used for numerous applications, as will be obvious to one of skill in the art, based on the description herein.

Figure 1:
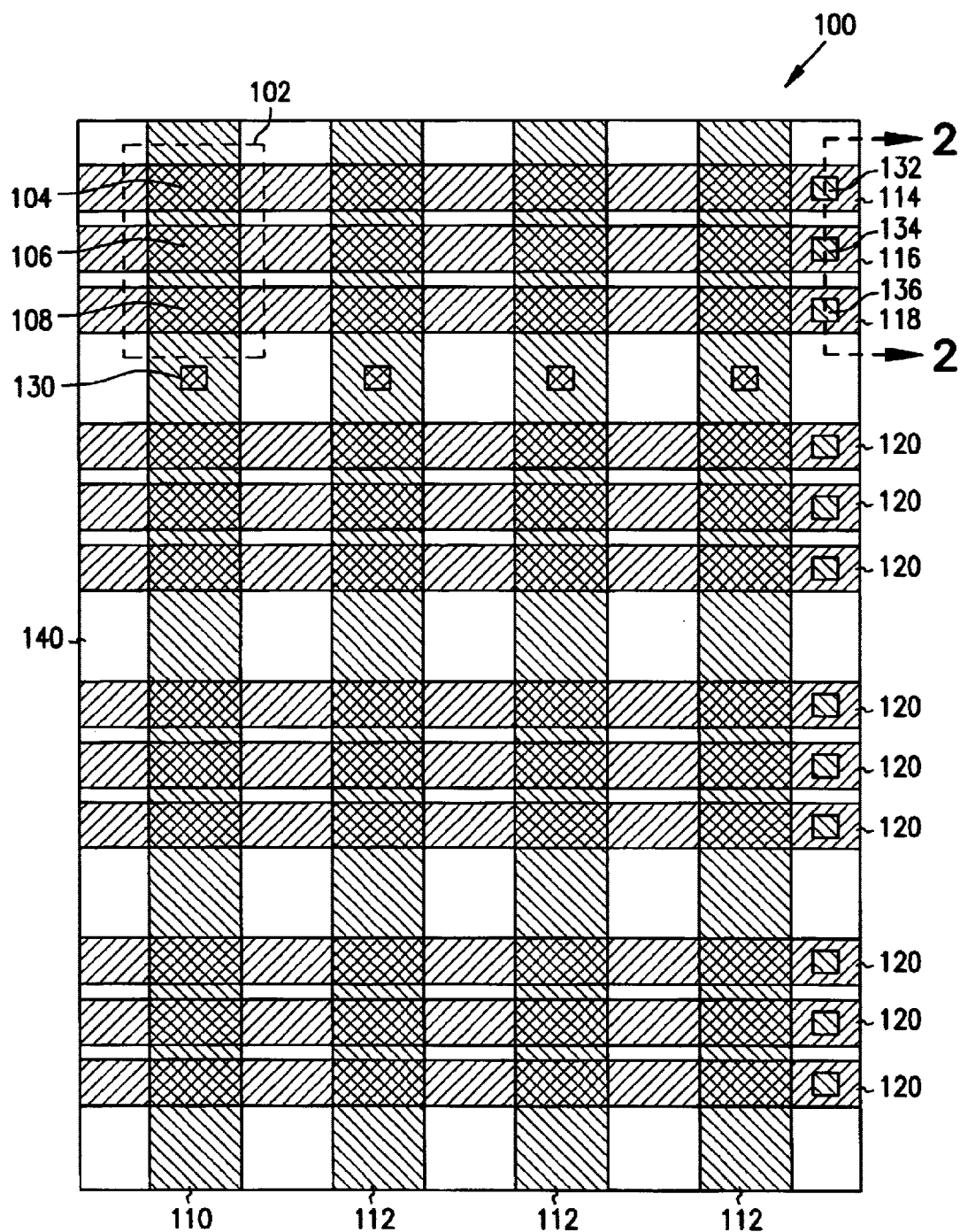
FIG. 1 illustrates a schematic, top view of an electronic assembly in accordance with one embodiment of the present invention.

FIG. 1 illustrates a schematic, top view of an electronic assembly 100 in accordance with one embodiment of the present invention. Assembly 100 forms part of a flat panel display device, in one embodiment. As will be described in more detail later in FIG. 2, assembly 100 includes a front panel, which is visible in FIG. 1, and a back panel, which is electrically connected to the front panel via conductive connections points 130, 132, 134, 136. As these connection points are concerned with important aspects of the invention, they will be discussed in detail later.

Assembly 100 is four color pixels wide in each direction. Each pixel is identical to representative pixel 102, which includes multiple optoelectronic display elements 104, 106, and 108. These elements are typically one each of red, green, and blue elements. In one embodiment, optoelectronic elements are formed of organic light emitting diode (OLED) materials, but other emissive devices such as electroluminescent elements, light emitting diodes, field emissive elements, plasma elements, and cathodoluminescent elements could be used, as well.

Each pixel lies at the intersection of one of multiple column electrodes 110, 112 and one of multiple row electrodes 114, 116, 118, 120. In particular, there is one column electrode for all three of the OLEDs in a pixel, and three row electrodes, one for each of the three colored OLEDs in the pixel. For example, pixel 102 lies at the intersection of a single column electrode 110 and a set of three parallel row electrodes 114, 116, 118. A unique combination of a single column electrode and one of a set of parallel row electrodes exists for each colored OLED throughout the array of pixels.

In one embodiment, column electrodes 110, 112 are formed of a transparent, conductive material, such as indium tin oxide ("ITO"), for example. This enables the light emitted from OLEDs 104, 106, 108 to be visible from above. Row electrodes 114, 116, 118, 120, on the other hand, need not be transparent. Accordingly, row electrodes 114, 116, 118, 120 can be formed of any conductive metal with sufficient electrical and mechanical characteristics, such as aluminum, for example. Other known materials could be used in other embodiments, such as other metals, organic conductors (e.g., polysilicon) or conductive inks and pastes (e.g., silver combined with a solvent).

FIG. 1 also illustrates a variety of electrical and mechanical connection points 130, 132, 134, 136, as will be discussed in more detail below. Each column electrode 110, 112 is associated with a single connection point 130 that serves the entire column electrode 110, 112 and all pixels that are attached to it. For example, connection point 130 is associated with column electrode 110, and therefore with pixel 102 and the other three pixels that lie downward of pixel 102 in that column.

Each of the three parallel row electrodes 114, 116, 118, 120 in a set of such electrodes is associated with a row connection. Pixel 102 is associated with row electrodes 114, 116, 118. It can be seen from FIG. 1 that these three row electrodes are connected to row connections 132, 134, 136, respectively.

Thus, in accordance with known principles, individual colored OLEDs are activated by passing electrical signals to each of the selected column and row electrodes to which they are attached. For example, to activate red OLED 104, column electrode 110 is energized at connection point 130, and row electrode 114 is energized at connection point 132; to activate green OLED 106, column electrode 110 is energized and row electrode 116 is energized at connection point 134; and to activate blue OLED 108, column electrode 110 is energized and row electrode 118 is energized at connection point 136.

The configuration shown in FIG. 1 is for ease of illustration only. In other embodiments, the row and column connection points 130, 132, 134, 136 could be located in different positions. For example, in another embodiment, some or all column and row connection points could lie in regions of assembly 100 that are underneath non-conductive material 140 or underneath OLEDs 102, instead of being located underneath row or column electrodes.

Figure 2:
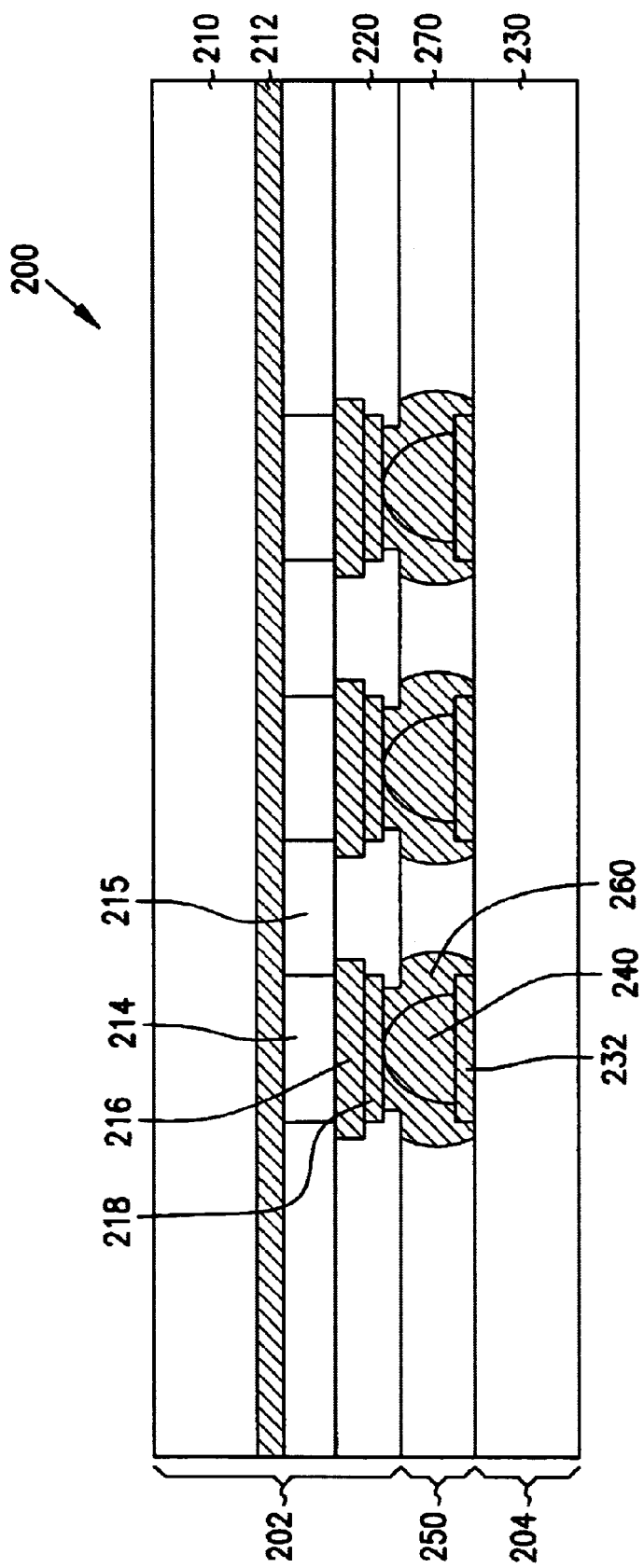
FIG. 2 illustrates a schematic, cross-sectional, side view of a portion of the electronic assembly shown in FIG. 1 along section lines A—A in accordance with one embodiment of the present invention.

FIG. 2 illustrates a schematic, cross-sectional, side view of a portion 200 of the electronic assembly shown in FIG. 1 along section lines A—A in accordance with one embodiment of the present invention. The portion 200 of the assembly includes one circuit board 202, referred to herein as a "front panel," and another circuit board 204, referred to herein as a "back panel."

Front panel 202 includes, in one embodiment, a glass substrate 210 having various electronic circuit elements. The circuit elements include, in one embodiment, column electrodes 212, row electrodes 216, and multiple optoelectrical display elements 214, which are electrically isolated from each other by a dielectric material 215 (e.g., polyimide or other similar inorganic materials). In addition, front panel 202 includes one or more bond pads 218, and a layer 220 of non-conducting material (e.g., AlO, $SiO_2$, Si nitride, Al nitride, etc.) on the bottom surface of front panel 202. Bond pads 218 are electrically connected to the front panel circuit elements. Although bond pads 218 appear to be directly underneath display elements 214 in FIG. 2, bond pads 218 could be horizontally offset from display elements 214.

Back panel 204 includes, in one embodiment, a ceramic substrate 230 having various electronic circuit elements (not shown) embedded within and/or located on surfaces of the substrate 230. The circuit elements include, in one embodiment, one or more layers of patterned conductive material. The conductive layers can be separated by one or more layers of dielectric material, and interconnected by conductive vias. Back panel 204 could include other or different circuit elements as well. Bond pads 232, located on the top surface of back panel 204, are electrically connected to the back panel circuit elements. Bond pads 232 are located on back panel 204 in a manner that is complementary to the locations of front panel bond pads 218, when the front panel 202 and the back panel 204 are aligned.

Bond pads 218 and 232 on the front panel 202 and back panel 204, respectively, are formed of a metal or alloy, which could include, for example, aluminum, copper, gold, nickel, or other commonly used metals and/or non-metals. In other embodiments, bond pads 218, 232 could be formed from organic conductors (e.g., polysilicon) or conductive inks or pastes (e.g., silver combined with a solvent). Bond pads 218, 232 are electrically connected to each other through one or more spacers 240 that are located in an interface region 250 between the bottom surface of front panel 202 and the top surface of back panel 204. Specifically, each spacer 240 is located between a complementary set of one front panel bond pad 218 and one back panel bond pad 232.

Spacers 240 act to provide physical separation of front panel 202 and back panel 204. Specifically, spacers 240 fix the height of the interface region 250 between front panel 202 and back panel 204. Desirably, the height of spacers 240 is selected so that the interface region height assumes a value that is optimum for the design and manufacture of the assembly.

In one embodiment, the height of spacers 240 is selected to result in an interface region height in a range of 0.5 to 5 mils. In other embodiments, the height of spacers 240 could be selected to achieve a wider or narrower interface region 250. The use of spacers 240 to define the height of interface region 250 makes flatness variations of the front and back panels less likely to result in open circuits between the front panel bond pads 218 and the back panel bond pads 232. Accordingly, the use of spacers 240 results in a higher manufacturing yield for the assemblies. In embodiments in which variations in flatness of each of the front and back panels have been accommodated by selecting relatively flexible panels, spacers 240 should be reasonably stiff, but shaped so as not to unacceptably damage the opposite panel during the process of aligning the panels and attaching them together.

Spacers 240 are formed of a conductive material. The conductive material is such that the spacers 240 remain in a solid form during the process of attaching the front panel 202 to back panel 204, as this process can include one or more heating stages. In one embodiment, spacers 240 are formed from a material that includes one or more metals from a group of metals that includes copper, gold, aluminum, tin, and nickel. The material can be a pure metal, or it can be an alloy formed from a mixture of metals (e.g., brass from copper and zinc) or of a mixture of metals and nonmetals. In one embodiment, spacers 240 are formed from a solder material having a melting temperature that is higher than temperatures reached during the process of attaching the front panel 202 to the back panel 204.

Spacers 240 can have any of a number of shapes. For example, in the embodiment illustrated in FIG. 2, spacers 240 have a bump shape. In other embodiments, spacers can be cubic, cylindrical, conical, spherical, or they can have other geometrical shapes, as would be obvious to one of skill in the art based on the description.

In one embodiment, spacers 240 are shaped such that they readily engage with pad openings in non-conducting layer 220 during the process of aligning front panel 202 and back panel 204. Accordingly, the combination of spacers 240 and the pad openings in layer 220 facilitate the alignment of front and back panels 202, 204 prior to attaching front panel 202 to back panel 204.

Assembly 200 also includes conductive material 260, in one embodiment, which is associated with each of the spacers 240. Conductive material 260 contacts the front panel 202, back panel 204, and each of the spacers 240. The combination of spacers 240 and conductive material 260 provides a high conductivity, low resistance interconnection between bond pads 218, 232.

Conductive material 260 is a solder material, in one embodiment, which has a melting temperature that is lower than temperatures reached during the process of attaching front panel 202 to back panel 204. Accordingly, conductive material 260 reflows and solidifies during the process of attachment, resulting in mechanical attachment of front panel 202 to back panel 204.

In another embodiment, conductive material 260 is a conductive adhesive, such as a polymeric material filled with conductive particles. The material may be selected from epoxy resins, other two-part heat- or photo-curable adhesives, moisture catalyzed adhesives, and thermosetting or thermoplastic polymers. The conductive particles may be selected from conductive particles, particles with a conductive coating, conductive filaments, conductive flakes, and conductive filaments and flakes that are magnetic.

As a conductive adhesive, conductive material 260 has a curing temperature that is lower than the temperatures reached during the process of attaching front panel 202 to back panel 204. Accordingly, the conductive adhesive cures during the process of attachment, resulting in mechanical attachment of front panel 202 to back panel 204. Attachment of front and back panels 202, 204 will be described in more detail in conjunction with FIG. 3, later.

The conductive material 260 associated with any one spacer 240 is electrically isolated from the conductive material 260 associated with the other spacers 240. This electrical isolation is achieved, in one embodiment, by an insulating material 270, which is also located in the interface region 250. In one embodiment, insulating material 270 is a polymeric material, such as a curable epoxy resin, for example.

Although, in the embodiments described, the front panel is a circuit board formed of a glass substrate and the back panel is a circuit board formed of a ceramic substrate, the various embodiments of the present invention could be applied to different types of circuit boards as well. In addition, the circuit boards being interconnected using the present invention can be composed of different types of substrates or the same type of substrate, in various embodiments.

The term "circuit board," as used to herein, means a substrate and conductive traces and/or electrical components that are embedded within or disposed on surfaces of the substrate. For example, a circuit board could be a ceramic circuit board or a printed circuit board that includes one or multiple layers of patterned conductive material separated by one or multiple layers of insulating material, where the layers are selectively interconnected by electrically conductive vias. Ceramic is meant in the broadest sense to include ceramics, glass ceramics, glass, and other high temperature insulating materials. Alternatively, a circuit board could be a glass panel upon which organic light emitting diodes (OLEDs) are deposited, along with conductive row and column electrodes that enable particular OLED regions to be selectively activated and deactivated.

Figure 3:
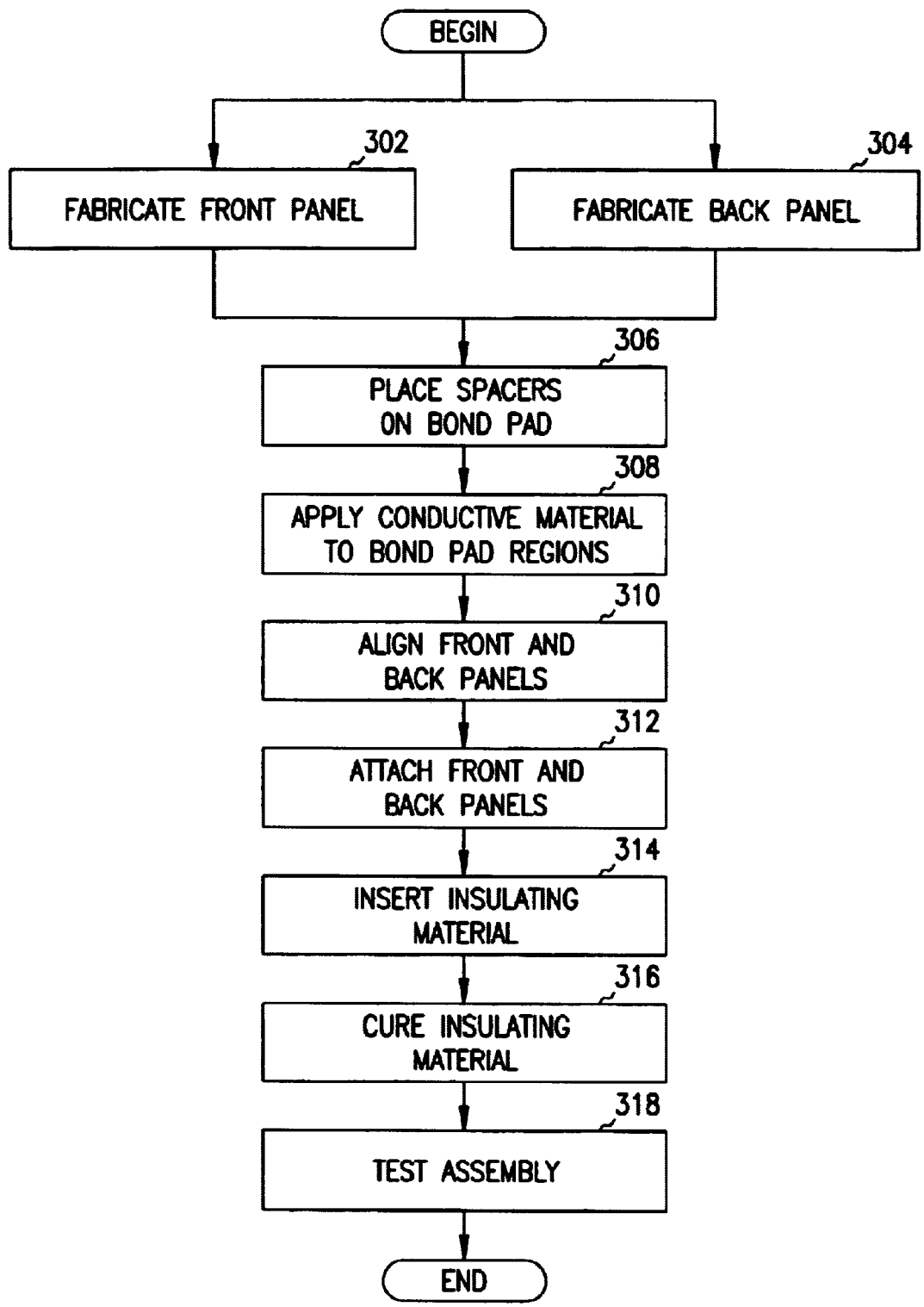
FIG. 3 illustrates a flowchart of a method for manufacturing an interconnected circuit board assembly in accordance with one embodiment of the present invention.

FIG. 3 illustrates a flowchart of a method for manufacturing an interconnected circuit board assembly in accordance with one embodiment of the present invention. FIG. 3 should be viewed in conjunction with FIGS. 4–10, which illustrate various stages of manufacturing an interconnected circuit board assembly in accordance with one embodiment of the present invention.

The method begins, in blocks 302 and 304, by fabricating a front panel 400 (FIG. 4) and a back panel 500 (FIG. 5), respectively. Processes 302 and 304 can happen in parallel or in any sequence.

The techniques employed in fabricating 302, 304 the front panel and back panel depend on the types of technologies embodied in the front panel and back panel. For example, when the front panel is a glass substrate with electronics formed on its surface, techniques well known to those of skill in that art are employed. When the back panel is formed using a ceramic substrate, techniques well known to those of skill in that art are employed. When the front and/or back panel are formed from different types of substrates, different fabrication techniques known to those of skill in the various arts would be employed. Discussion of the various fabrication techniques are beyond the scope of this description.

Referring to FIG. 4, front panel 400 includes, in one embodiment, a glass substrate 402, column electrodes 404, multiple optoelectrical display elements 406, row electrodes 408, one or more bond pads 410, and a layer 412 of non-conducting material. Each of these elements was discussed in detail, above, in conjunction with FIG. 2. The layer 412 of non-conducting material includes openings 414 to bond pads 410. As will be described later, these pad openings 414 facilitate alignment of front panel 202 with back panel 204, in one embodiment.

Referring to FIG. 5, back panel 500 includes, in one embodiment, a ceramic substrate 502 having various electronic circuit elements (not shown) embedded within and/or located on surfaces of the substrate 502. In addition, back panel 500 includes bond pads 504, located on the top surface of back panel 500, which are electrically connected to the back panel circuit elements. As discussed previously, bond pads 504 are located in a manner that is complementary to the locations of front panel bond pads 410 (FIG. 4), when the front panel 400 and the back panel 500 are later aligned.

Referring back to FIG. 3, in block 306, spacers 602 (FIG. 6) are placed on the back panel bond pads 504. Spacers 602 are placed on bond pads 504, in several embodiments, by forming the spacers 602 on bond pads 504. Spacers 602 are formed and attached simultaneously, in one embodiment, using a selective electroplating process, followed by coining to shape, if necessary. In another embodiment, solder is printed or otherwise deposited on bond pads 504, and the solder is heated and reflowed to simultaneously form and attach spacers 602 to bond pads 504.

In other embodiments, spacers 602 are formed and attached to bond pads 504 using separate processes. For example, in one embodiment, pre-formed spacers 602 are attached to bond pads 504 by welding spacers 602 to bond pads 504. In still another embodiment, pre-formed spacers 602 are attached to bond pads 504 by applying solder to bond pads 504 and/or spacers 602, placing spacers 602 on bond pads 504, and reflowing the solder. In still another embodiment, spacers 602 can be attached to bond pads 504 using a conductive adhesive. In still another alternate embodiment, back panel 500 can include a non-conducting layer with bond pad openings, similar to layer 412 and pad openings 414 (FIG. 4). This non-conducting layer can be in addition to or instead of layer 412 on front panel 400. Spacers 602 can be placed into the back panel, pad openings and held in place by the sides of the pad openings and by gravitational forces. In still other alternate embodiments, some or all of spacers 602 could be placed on and/or attached to bond pads 410 (FIG. 4) on front panel 400.

Referring again to FIG. 3, in block 308, after spacers 602 are placed on bond pads, conductive material 702 (FIG. 7) is applied to the bond pad regions, in one embodiment. Specifically, conductive material 702 is placed in proximity to areas where each of the spacers 602 will contact complementary sets of bond pads. In one embodiment, conductive material 702 is applied in contact with each of spacers 602. In another embodiment, conductive material 702 is applied to the bond pads (e.g., bond pads 410, FIG. 4) that oppose spacers 602 in a complementary manner.

Conductive material 702 could be a conductive paste, conductive adhesive, solder, or another suitable material, in various embodiments. In one embodiment, where conductive material 702 is a material that requires curing, conductive material 702 could be cured to a "b-stage," prior to alignment and attachment of front panel 400 and back panel 500. Whatever the material used for conductive material 702, conductive material 702 has a melting or curing temperature that is below the melting temperature of spacers 602.

Figure 8:
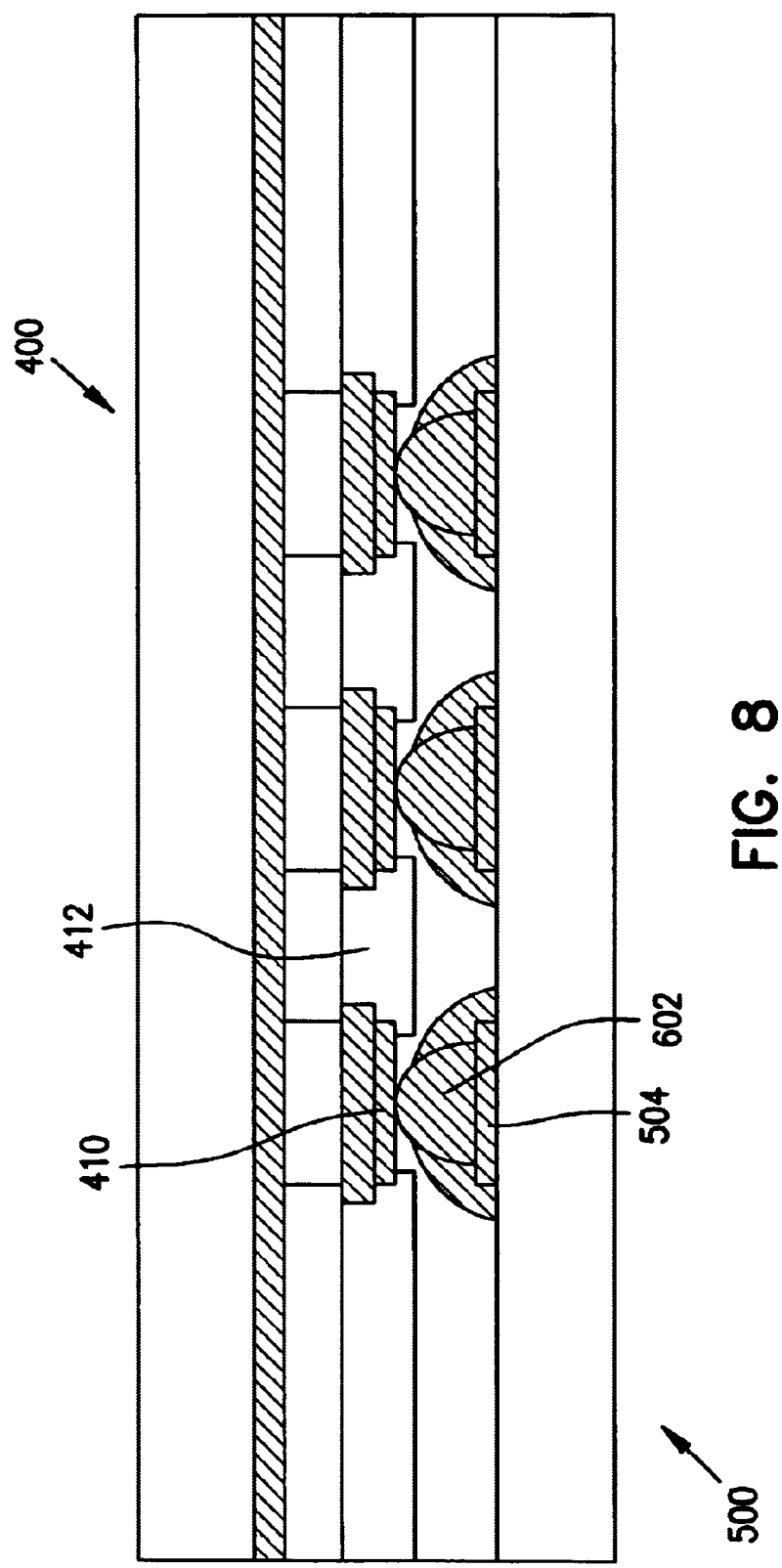

Referring back to FIG. 3, the front panel 400 and back panel 500 are aligned, in block 310, and front panel 400 is brought into contact with spacers 602. As illustrated in FIG. 8, spacers 602 engage in the pad openings in non-conductive layer 412. In this manner, the front panel bond pads 410 align with complementary ones of the back panel bond pads 504. In addition, front panel bond pads 410 make physical contact with spacers 602.

Referring again to FIG. 3, in block 312, the front and back panels 400, 500 are attached together. In one embodiment, attaching the front and back panels is performed by heating the assembly, including the conductive material 702, and then allowing the assembly to cool.

Figure 9:
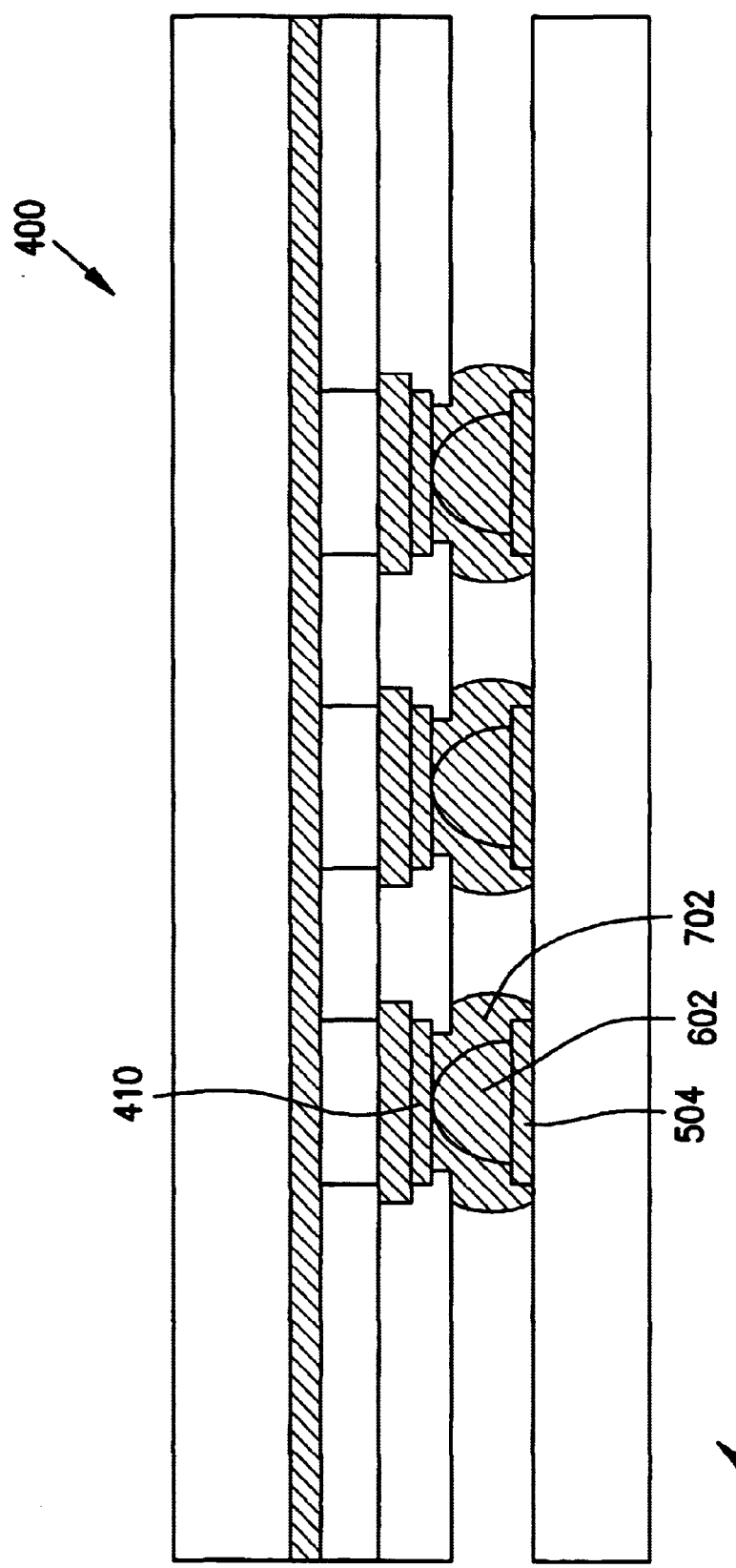
Figure 10:
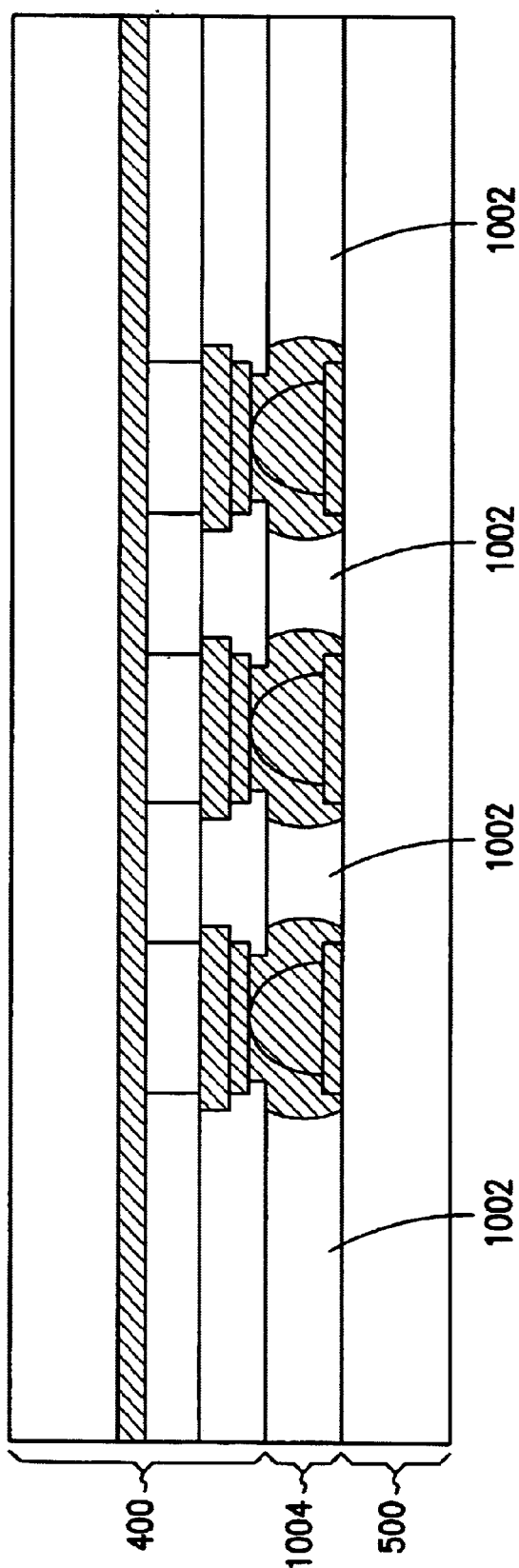

Referring to FIG. 9, in an embodiment where conductive material 702 is solder, the conductive material 702 is heated to temperatures sufficient to reflow the solder, causing it to wick and connect to front panel bond pads 410. When cooled, the solidified solder 702 forms a mechanical bond between front panel bond pads 410, spacers 602, and back panel bond pads 504.

In an embodiment where conductive material 702 is a conductive adhesive, sufficient adhesive is associated with each spacer 602 to adhere to both front panel 400 and back panel 500 when front panel 400 is aligned and brought into contact with spacers 602. The adhesive 702 is then heated to temperatures sufficient to cure the adhesive 702. When cooled, the hardened adhesive 702 forms a mechanical bond between front panel bond pads 410, spacers 602, and back panel bond pads 504. In still another embodiment, conductive material 702 is not used, and the front and back panels are attached using some other technique.

Referring again to FIG. 3, in block 314, insulating material 1002 (FIG. 10) is inserted into the interface region 1004 between front panel 400 and back panel 500. In one embodiment, insulating material 1002 is a polymeric material that is injected into the interface region 1004 in its uncured form (i.e., its liquid form). This is achieved, in one embodiment, using a vacuum fill process.

Although insulating materials besides a polymeric material could be used in other embodiments, as would be obvious to one of skill in the art based on the description herein, the selected insulating material should have several characteristics. First, the material, in its uncured form, should have a sufficiently low viscosity to allow nearly 100% backfill of interface region 1004. In addition, the material should be a fairly good adhesive in order to mechanically connect the front panel 400 to the back panel 500. Finally, the material should form a good barrier against the migration of outside contaminants, which otherwise may damage the structure and/or electrical properties of the assembly.

In block 316, the assembly, and thus insulating material 1002, is heated to temperatures sufficient to cure the insulating material. The assembly is then cooled so that insulating material 1002 hardens, thus forming an additional mechanical bond between front panel 400 and back panel 500.

In another embodiment, the insulating material 1002 is not inserted into the interface region, in block 314. Instead, the insulating material, in its uncured form, is applied to either the front panel 400, the back panel 500, or both panels prior to aligning and attaching the front and back panels in blocks 310 and 312. The insulating material 1002 is then partially cured to a "b-stage," so that it will not be displaced during the aligning and attaching processes. Finally, after aligning and attaching the panels, the assembly, and thus insulating material 1002 are fully cured.

In one embodiment, insulating material 1002 has a higher thermal expansion coefficient than the thermal expansion coefficient for spacers 602 and conductive material 702. Accordingly, the cured insulating material 1002 will be in tension, while the interconnections formed from the spacers 502 and conductive material 702 will be in compression. This suppresses the disposition for the interconnections to delaminate. In other embodiments, the thermal expansion coefficient of insulating material 1002 could be equal to or less than the thermal expansion coefficient of the interconnections.

Referring back to FIG. 3, the assembly is tested, in block 318, to detect any open circuits between complementary bond pads on the front and back panels. When zero or a sufficiently small number of open circuits are detected, the assembly is considered acceptable for further inclusion into an electronic system. The method then ends.

Figure 11:
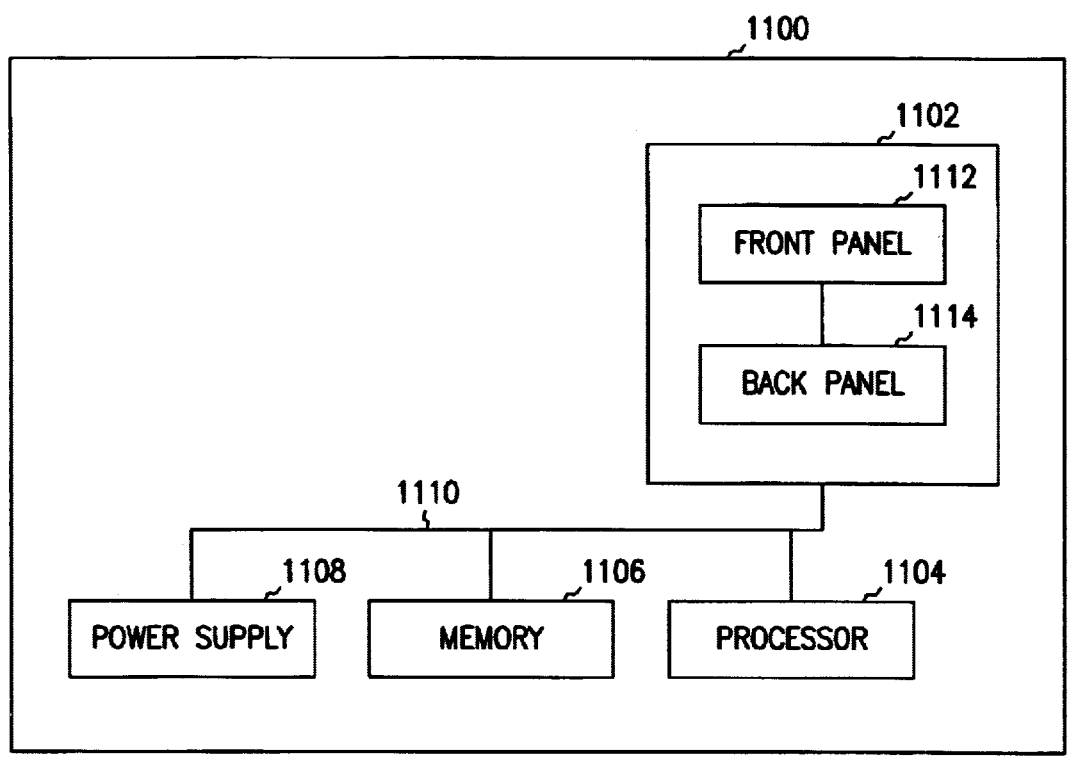
FIG. 11 illustrates a simplified block diagram of an electronic system that includes an interconnected circuit board assembly in accordance with one embodiment of the present invention.

FIG. 11 illustrates a simplified block diagram of an electronic system 1100 that includes an interconnected circuit board assembly 1102 in accordance with one embodiment of the present invention. System 1100 could be, for example, a computer, a wireless or wired communication device (e.g., telephone, cellular phone, pager, radio, etc.), a television, a monitor, a projector, or virtually any other type of electronic system.

The electronic system is housed on one or more PC boards, and includes circuit board assembly 1102, processor 1104, memory 1106, power supply 1108, and bus 1110. Circuit board assembly 1102 includes a front panel 1112 and a back panel 1114, which are interconnected in accordance with various embodiments of the present invention. In one embodiment, processor 1104 functions as an image generator, and assembly 1102 forms a portion of a flat panel display, which converts an image signal from processor 1104 into an image signal. Bus 1110 couples assembly 1102, processor 1104, memory 1106, and power supply 1108, in one embodiment. However, it is to be understood that in alternate embodiments, the various components of system 1100 could be electrically connected through different busses or different types of connections.

Conclusion

Various embodiments of an interconnected circuit board assembly and methods of manufacturing that assembly have been described, along with a description of the incorporation of the assembly within an electronic system. Although a module for a flat panel display has been described, the various embodiments of the invention can be applied to more general problems and systems, and is of particular use when the two circuit boards are fabricated with incompatible technologies, although they could be fabricated with compatible technologies, as well. Therefore, this description is illustrative of the invention, but not limiting of the full scope of the invention.

While the foregoing examples of dimensions and ranges are considered typical, the various embodiments of the invention are not limited to such dimensions or ranges. It is recognized that the trend within industry is to generally increase the number of interconnections per unit area for the associated cost and performance benefits.

In the foregoing detailed description of the preferred embodiments, reference is made to the accompanying drawings, which form a part hereof, and in which are shown by way of illustration specific embodiments in which the invention may be practiced. These embodiments are described in sufficient detail to enable those skilled in the art to practice the invention.

It will be appreciated by those of ordinary skill in the art that any arrangement, which is calculated to achieve the same purpose, may be substituted for the specific embodiments shown. For example, although an assembly that includes an interconnected glass circuit board and ceramic circuit board is described, the various embodiments could be used to interconnect other types of circuit board combinations. It should be understood that details of layer configuration, overlap, etc., that are not critical to the scope of the invention are not necessarily shown in the Figures, because the Figures are schematic in nature.

This application is intended to cover any adaptations or variations of the present invention that fall within its scope. The foregoing detailed description is, therefore, not to be taken in a limiting sense, and it will be readily understood by those skilled in the art that various other changes in the details, materials, and arrangements of the parts and steps which have been described and illustrated in order to explain the nature of this invention may be made without departing from the scope of the invention as expressed in the adjoining claims.

What is claimed is:

1. An interconnected circuit board assembly, comprising:
   a first circuit board having a bottom surface and one or more first bond pads located on the bottom surface, the first circuit board including
   a glass substrate,
   multiple optoelectrical display elements located on a surface of the glass substrate, and
   the first bond pads electrically connected to the multiple optoelectrical display elements;
   a second circuit board having a top surface and one or more second bond pads located on the top surface in a manner that is complementary to locations of the one or more first bond pads;
   one or more spacers located in an interface region between the bottom surface of the first circuit board and the top surface of the second circuit board, wherein each spacer of the one or more spacers is located between one of the one or more first bond pads and one of the one or more second bond pads, and wherein the one or more spacers are formed of a conductive material that remains in a solid form during a process of attaching the first circuit board to the second circuit board; and
   an insulating material located in the interface region, wherein the insulating material contacts and mechanically connects together both the first circuit board and the second circuit board.

2. The interconnected circuit board assembly as claimed in claim 1, wherein the insulating material is a polymeric material.

3. The interconnected circuit board assembly as claimed in claim 2, wherein the insulating material is injected into the interface region in an uncured form and cured in a subsequent heating process.

4. The interconnected circuit board assembly as claimed in claim 1, wherein the insulating material has a higher first thermal expansion coefficient than a second thermal expansion coefficient of the one or more spacers.

5. An electronic system comprising:
   a processor, which functions as an image generator; and
   an interconnected circuit board assembly, coupled to the processor, which includes
   a first circuit board having a bottom surface and one or more first bond pads located on the bottom surface, wherein the first circuit board includes
   a glass substrate,
   multiple optoelectrical display elements located on a surface of the glass substrate, and
   the first bond pads electrically connected to the multiple optoelectrical display elements, and
   a second circuit board having a top surface and one or more second bond pads located on the top surface in a manner that is complementary to locations of the one or more first bond pads, wherein the second circuit board includes
   a ceramic substrate,
   one or more layers of patterned conductive material located in and on the ceramic substrate, and
   the second bond pads electrically connected to the one or more layers of
   patterned conductive material, and
   one or more spacers located in an interface region between the bottom surface of the first circuit board and the top surface of the second circuit board, wherein each spacer of the one or more spacers is located between one of the one or more first bond pads and one of the one or more second bond pads, and wherein the one or more spacers are formed of a conductive material that remains in a solid form during a process of attaching the first circuit board to the second circuit board, and
   an insulating material located in the interface region, wherein the insulating material contacts and mechanically connects together both the first circuit board and the second circuit board.

6. The electronic system as claimed in claim 5, wherein the insulating material is a polymeric material.

7. The electronic system as claimed in claim 6, wherein the insulating material is injected into the interface region in an uncured form and cured in a subsequent heating process.

8. The electronic system as claimed in claim 5, wherein the insulating material has a higher first thermal expansion coefficient than a second thermal expansion coefficient of the one or more spacers.

* * * * *